United States Patent
Sato et al.

(10) Patent No.: US 9,099,459 B2
(45) Date of Patent: Aug. 4, 2015

(54) SEMICONDUCTOR DEVICE AND MANUFACTURING METHOD OF THE SAME

(71) Applicant: KABUSHIKI KAISHA TOSHIBA, Tokyo (JP)

(72) Inventors: Takao Sato, Mie (JP); Masatoshi Fukuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,027

(22) Filed: Aug. 30, 2013

(65) Prior Publication Data

US 2014/0284817 A1    Sep. 25, 2014

(30) Foreign Application Priority Data

Mar. 21, 2013  (JP) ................................. 2013-058303

(51) Int. Cl.
| | |
|---|---|
| *H01L 21/44* | (2006.01) |
| *H01L 21/48* | (2006.01) |
| *H01L 25/00* | (2006.01) |
| *H01L 25/07* | (2006.01) |

(52) U.S. Cl.
CPC .............. *H01L 25/50* (2013.01); *H01L 25/074* (2013.01); *H01L 2224/13* (2013.01); *H01L 2224/16145* (2013.01)

(58) Field of Classification Search
CPC ... H01L 25/50; H01L 25/074; H01L 2224/13; H01L 2224/16145

USPC .................................................. 438/108, 109
See application file for complete search history.

(56) References Cited

U.S. PATENT DOCUMENTS

| | | | | |
|---|---|---|---|---|
| 7,824,960 | B2* | 11/2010 | Hao et al. ....................... | 438/109 |
| 7,892,889 | B2* | 2/2011 | Howard et al. ................ | 438/109 |
| 2012/0074529 | A1* | 3/2012 | Kim et al. ...................... | 257/621 |
| 2012/0276733 | A1* | 11/2012 | Saeki et al. .................... | 438/613 |

FOREIGN PATENT DOCUMENTS

JP        2010-251408 A        11/2010

* cited by examiner

*Primary Examiner* — Hung Vu
(74) *Attorney, Agent, or Firm* — Patterson & Sheridan, LLP

(57) ABSTRACT

According to one embodiment a method is provided including positioning and bonding a plurality of first semiconductor chips in a coplanar relation on a first substrate, laminating at least a plurality of second semiconductor chips on the first semiconductor chips, cutting the first substrate for separation into a discrete chip lamination, aligning an electrode pad provided on a surface of the discrete lamination with an electrode pad on a second substrate, and temporarily connecting the electrode pads on the lamination and the second substrate in an opposing relation to the first substrate, providing electrical connection between the electrode pads by a reflow process, flowing a liquid resin from the side of the first substrate towards the second substrate to seal the chip lamination and spaces between the chip lamination and the first and second substrate, and cutting the chip lamination to form a discrete device.

16 Claims, 7 Drawing Sheets

US 9,099,459 B2

SEMICONDUCTOR DEVICE AND MANUFACTURING METHOD OF THE SAME

CROSS-REFERENCE TO RELATED APPLICATION

This application is based upon and claims the benefit of priority from Japanese Patent Application No. 2013-058303, filed Mar. 21, 2013, the entire contents of which are incorporated herein by reference.

FIELD

Embodiments described herein relate to a semiconductor device and a manufacturing method of this semiconductor device.

BACKGROUND

In the manufacture of devices requiring high degree of miniaturization and integration, such as NAND-type flash memories, there exists a method where a number of semiconductor chips having a thin-cross-section are stacked together and interconnected front to back and then sealed with a resin, i.e., laminated and then sealed in resin. Another method exists where semiconductor chips are sealed with a resin and then a number of layers of the resin-sealed semiconductor chips are interconnected. Wire-bonding is generally used for providing communication of signals from the respective semiconductor chips. However, to increase the signal transmission speed, a laminating system using TSV (through silicon VIA) is currently proposed. An example of this laminating system includes sequentially laminating chips one over the other on a carrier substrate made of metal and the carrier substrate is provided with a member for preventing outflow of sealing material therefrom. The spaces between the chips are sealed with resin in a manner where bumps of interface chips on the uppermost layer can be exposed. Then, discrete wiring substrates are joined to connection terminals of the interface chips on the uppermost layer. After the peripheral portions of the chips are sealed by molding, the carrier substrate with the molded resin thereabout is diced. While this method is a highly efficient mounting method, the necessity of enlarging the carrier substrate in accordance with the volume of the member for preventing outflow of sealing material increases the package size. In addition, the finish of the surface produced by dicing using a blade is less than satisfactory.

DETAILED DESCRIPTION

Embodiments provide a semiconductor device which is compact and has an excellent finish on cut surfaces.

According to one embodiment, the following steps are included: positioning a first layer comprising a plurality of first semiconductor chips in the same plane on a first substrate, and bonding the semiconductor chips to the first substrate, laminating at least one second layer comprising a plurality of second semiconductor chips on respective first semiconductor chips, cutting the first substrate to form a discrete lamination of a portion of the underlying substrate and the first and second chips laminated thereover, aligning an electrode pad provided on a surface of the discrete lamination with an electrode pad on a second substrate, and temporarily connecting the electrode pads on the discrete lamination and the second substrate in an opposing relation to the first substrate, providing electrical connections between the respective electrode pads by a reflow process, flowing resin from the side of the first substrate toward the second substrate to seal spaces between the first and second semiconductor chips and between the lamination and the second substrate, and cutting edges of the resin-sealed lamination together with the first substrate and the second substrate using a dicing blade for separation into a discrete piece.

A laminated semiconductor device and a manufacturing method of this laminated semiconductor device according to an embodiment are hereinafter described in detail with reference to the accompanying drawings. A semiconductor memory device as disclosed in this embodiment as a semiconductor chip which includes memory chips, such as NAND-type flash memories, is described. However, memory devices utilizing chips other than NAND-type flash memories may also benefit from the embodiments. In the respective figures referred to herein, the scaling of the respective parts may be different from the actual size for easy understanding of the figures. The orientation of the devices in the figures is for reference only and may not be the actual orientation of the actual device.

First Embodiment

Figure 1A:
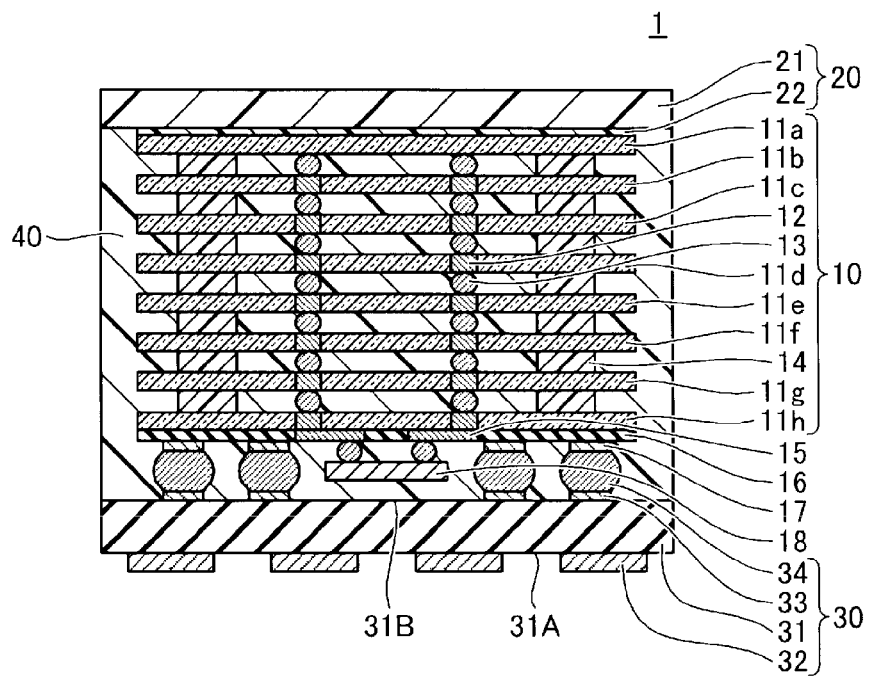
FIG. 1A is a cross-sectional view schematically illustrating a semiconductor device according to a first embodiment.
Figure 1B:
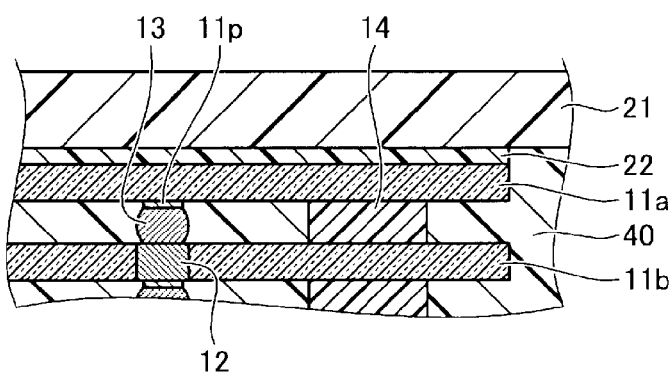
FIG. 1B is a cross-sectional view of an enlarged main part of the semiconductor device according to the first embodiment.
Figure 1C:
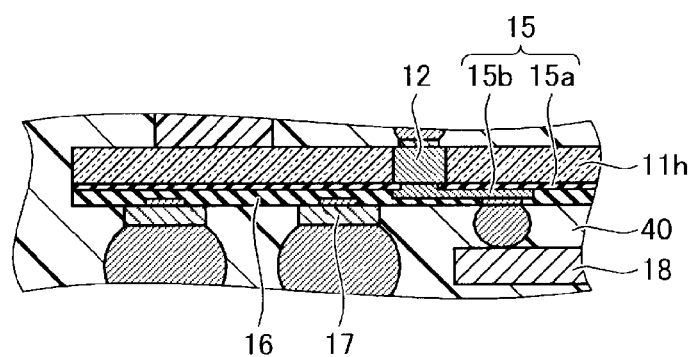
FIG. 1C is a cross-sectional view of an enlarged main part of the semiconductor device according to the first embodiment.

FIG. 1A is a cross-sectional view schematically illustrating a semiconductor memory device according to a first embodiment, while FIGS. 1B and 1C are cross-sectional views illustrating the enlarged main part of the semiconductor memory device. FIGS. 2A through 2H are cross-sectional views illustrating manufacturing steps of the semiconductor device. A semiconductor device 1 in this embodiment includes first and second substrates 20 and 30 disposed opposite to each other and having the same size, a chip lamination 10, which contains a plurality of layers of semiconductor chips 11a through 11h, sandwiched between the first and second substrates 20 and 30 and electrically connected with at least one of the first and second substrates 20 and 30, and a sealing resin 40. The sealing resin 40 seals the spaces between the first and second substrates 20 and 30, between the semiconductor chips 11a through 11h constituting the chip lamination 10, and between the first and second substrates 20 and 30 and the chip lamination 10. A characteristic aspect of the semiconductor device 1 is that the outer periphery of the sealing resin 40 lies on a line connecting the outer peripheries of the first and second substrates 20 and 30.

According to this embodiment, the first substrate 20 is formed by a resin substrate or the like easy for cutting. After the semiconductor chips 11a through 11h are laminated on the first substrate 20, the first substrate 20 is cut together with the semiconductor chips 11a through 11h to produce the chip lamination 10. The chip lamination 10 is joined to the second substrate 30 (wiring substrate), whereupon the sealing resin 40 is applied as a liquid and hardened on the chip lamination 10. After the step of resin-sealing for the spaces between the respective semiconductor chips 11a through 11h and between the chip lamination 10 and the second substrate 30 in this manner, cutting is performed using a dicing blade $B_1$ (shown in FIG. 2G) to produce discrete pieces.

The second substrate 30 has a resin substrate 31, and external connection terminals 32 are provided on a first surface 31A of the resin substrate 31. When the semiconductor memory device is to be included in a BGA package, the external connection terminals 32 are constituted by projection terminals containing solder balls, solder plating, Au plating or the like. When the semiconductor memory device is to be included in an LGA package, the external connection terminals are constituted by metal lands. Internal connection terminals 33 are provided on a second surface 31B of the resin substrate 31 and connected with electrode pads 17 of the chip lamination 10 via solder balls 34. The internal connection terminals 33 function as connection units (connection pads) during connection with the chip lamination 10, and electrically connect with the external connection terminals 32 via a wire net (not shown) of the second substrate 30. The chip lamination 10 containing the plural semiconductor chips 11a through 11h are fixed to the second surface 31B of the resin substrate 31.

Figure 2A:
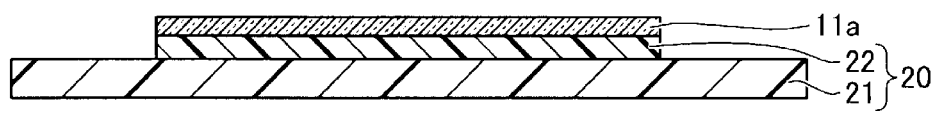
FIG. 2A is a cross-sectional view illustrating a manufacturing step of the semiconductor device according to the first embodiment.

A manufacturing method of the semiconductor device according to this embodiment is now explained. In one aspect, an initial step includes affixing a resin film 21 made of heat-resisting material such as PI (polyimide) to a metal frame, or the like, which supports the resin film 21 thereon to produce the first substrate 20 in a conveyable condition. According to this embodiment, the first substrate 20 is constituted by the resin film 21 and a thermosetting adhesive 22 formed thereon. The first semiconductor chips 11a corresponding to the first layer of the lamination are bonded to predetermined positions of the first substrate 20. The plural semiconductor chips 11a on the first layer are mounted at predetermined intervals on a flat surface of the resin film 21 (FIG. 2A). In a practical method, patterns are used, such as marked copper foils formed on the resin film, and the semiconductor chips are mounted in accordance with these marks. These patterns can also be used in the dicing step.

Figure 2B:
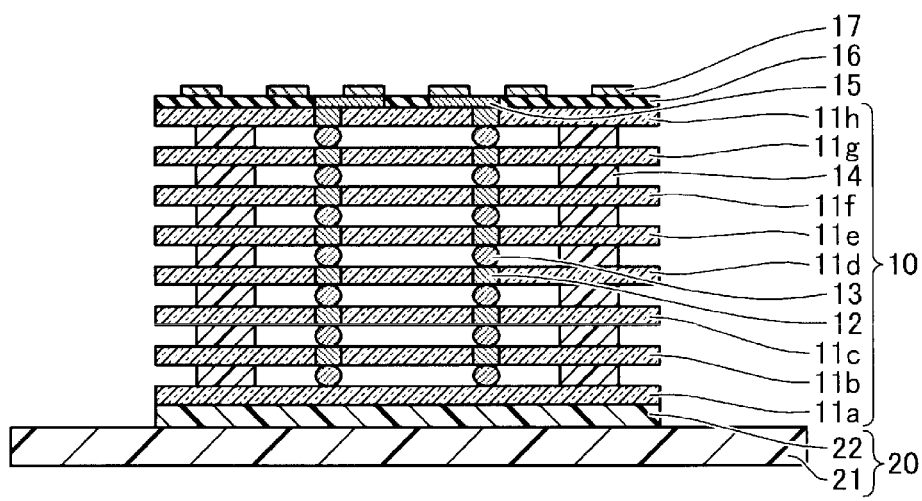
FIG. 2B is a cross-sectional view illustrating a manufacturing step of the semiconductor device according to the first embodiment.
Figure 2C:
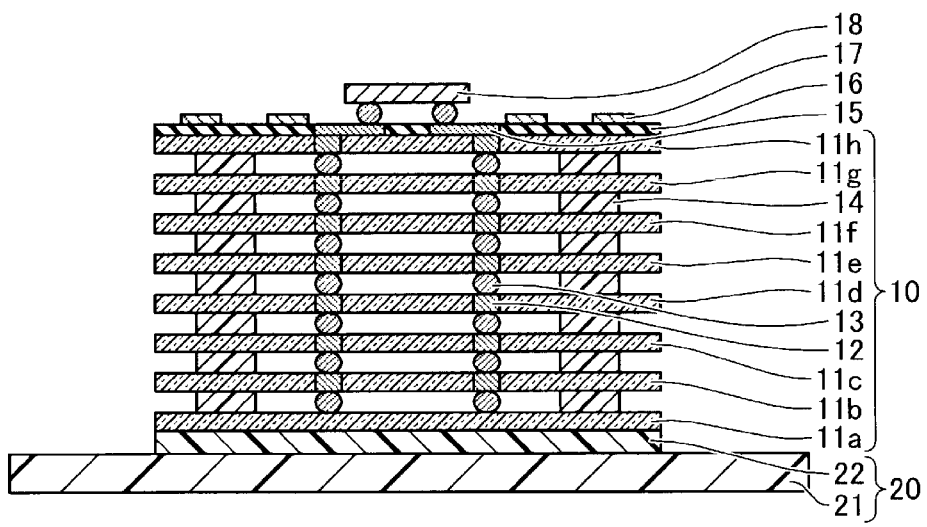
FIG. 2C is a cross-sectional view illustrating a manufacturing step of the semiconductor device according to the first embodiment.

The chip lamination 10 is formed by sequentially laminating a predetermined number of layers of the semiconductor chips (11b through 11h) on the respective semiconductor chips 11a. In the step of production of the chip lamination 10, the semiconductor chips 11a through 11h are laminated according to alignment of mutual connections thereof in a manner where a pad electrode 11p and a bump electrode 13 formed on one semiconductor chip (11a) and between other surfaces of each semiconductor chip 11b through 11h so (silicon) through electrodes 12 formed in the semiconductor chips can contact each other and electrically connect the semiconductor chips 11a through 11h. Adhesives 14 are provided on plural spots on one surface of each of the laminated semiconductor chips 11a through 11h in areas other than the pad electrodes 11p providing an electrical connection. The adhesives 14 are bonded and fixed to the opposed surfaces of the adjacent semiconductor chips during lamination of the semiconductor chips 11a through 11h (FIG. 2B).

A subsequent step provides mounting an interface chip (IF chip) 18 on a rewiring layer 15 provided on the surface of the semiconductor chips 11h on the uppermost layer of the chip lamination 10. As illustrated in the cross-sectional view of the enlarged main part in FIG. 1C, the rewiring layer 15 includes an insulating film 15a and a wiring layer 15b provided on the surface of the uppermost chip of the semiconductor chips (11h). A protection film 16 covers the surface of the rewiring layer 15. Electrode pads 17 are formed at the connection positions between the rewiring layer 15 and the IF chip 18 and between the rewiring layer 15 and the wiring substrate corresponding to the second substrate 30. The IF chip 18 has an interface (IF) circuit providing data communication between an outside device and the semiconductor chips 11a through 11h as plural memory chips constituting the chip lamination 10. The IF chip 18 connects with the chip lamination 10 by a flip-chip connection (FC connection). The space between the IF chip 18 and the chip lamination 10 is filled with liquid resin which constitutes a part of the sealing resin 40 (FIG. 1C).

Figure 2D:
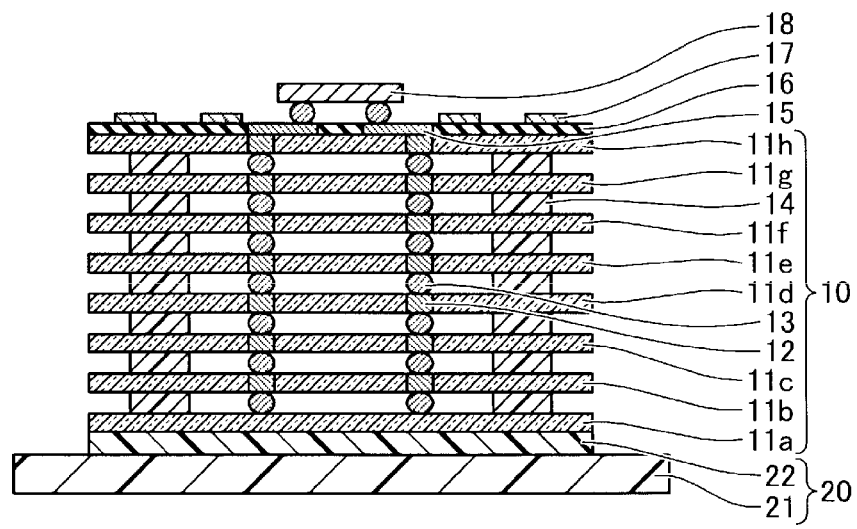
FIG. 2D is a cross-sectional view illustrating a manufacturing step of the semiconductor device according to the first embodiment.

The resin film around the lamination is then cut in such a position that the resin film becomes larger than the chips of the lamination so as to produce the discrete lamination (FIG. 2D). The cutting method may be arbitrarily selected from methods such as cutting with a metal mold, cutting by a cutter, blade dicing, and other methods. Alternatively, a shape containing slits or the like formed in such positions that the resin film becomes larger than the chips may be prepared beforehand so that the resin film can be cut at the positions of the slits.

Figure 2E:
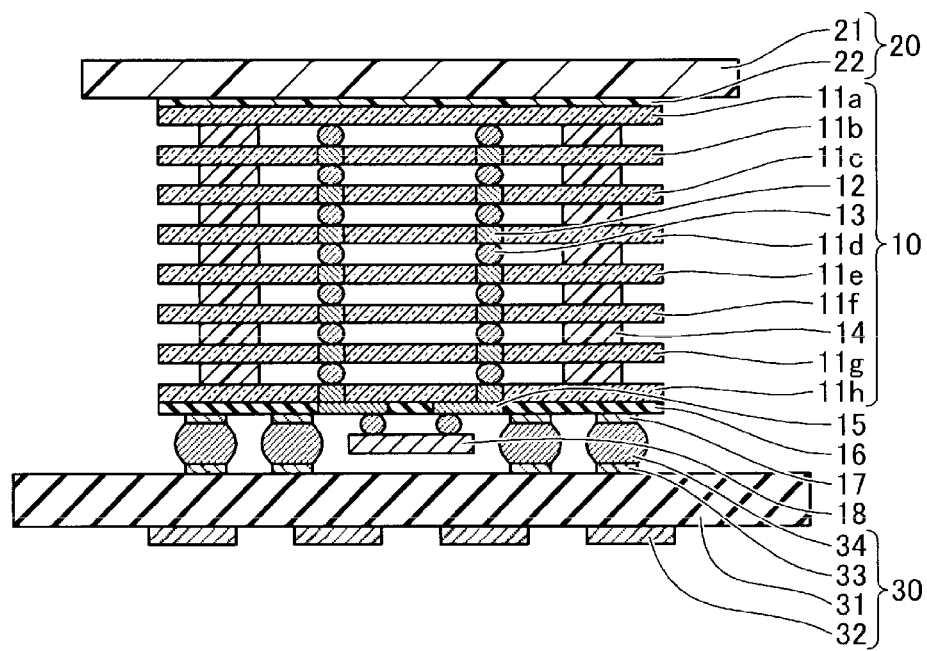
FIG. 2E is a cross-sectional view illustrating a manufacturing step of the semiconductor device according to the first embodiment.

The discrete chip lamination 10 is then aligned with the corresponding internal connection terminals 33 of the second substrate 30 in a position where the internal connection terminals (electrode pads) 33 on the chip side are in proximity to the second substrate 30 corresponding to the wiring substrate. In other words, the internal connection terminals (electrode pads) 33 are in a position such that the first substrate (resin film) 20 side to which the chip lamination 10 is affixed is located away from the second substrate 30. After this alignment, the chip lamination 10 is temporarily bonded to the second substrate 30 by a temporary fixing member applied beforehand. Then, the chip lamination 10 and the second substrate 30 are heated under a formate gas atmosphere or other reductive gas atmospheres (reflow) to electrically connect the chip lamination 10 and the second substrate 30 (FIG. 2E). The electrode pads 17 (internal connection terminals 33) are primarily made of a solder material or Au to provide electrical connections simultaneously between the semiconductor chips 11a through 11h of the lamination and between the semiconductor chips 11h and the second substrate 30. The electric connection between the semiconductor chips 11h on the layer of the chip lamination 10 and the second substrate 30 may be separately provided. The heating is carried out in the reductive gas atmosphere so as to deoxidize and remove oxide film and the like formed on the surface for secure electric connection. The through electrodes 12 are primarily made of Cu and are provided between the laminated semiconductor chips 11a through 11h at positions corresponding to the respective electrode pads (internal connection terminals 33). Semiconductor chips having sizes different from the sizes of the plural laminated semiconductor chips may be mounted as necessary.

Figure 2F:
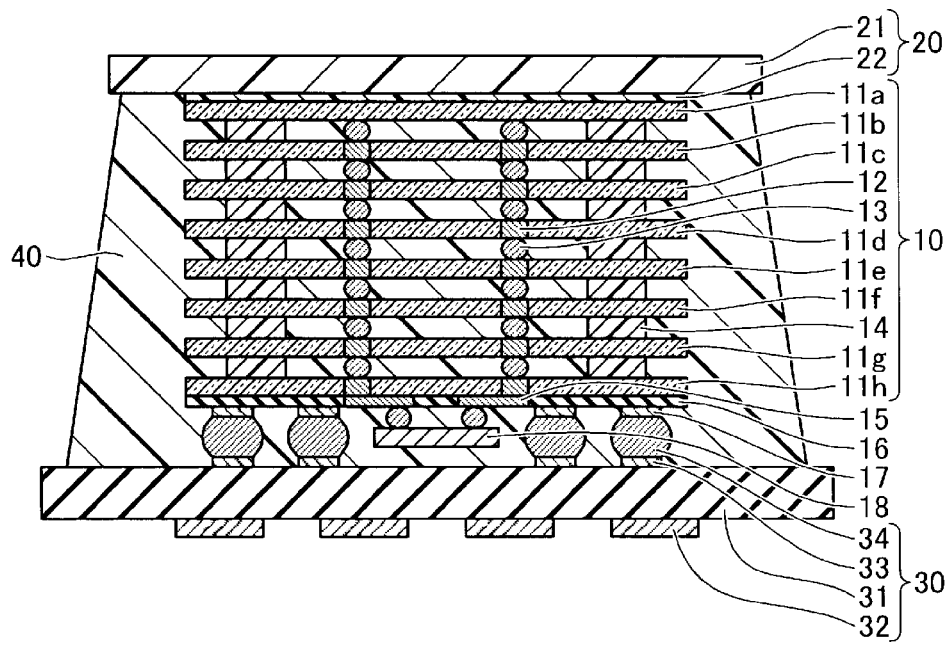
FIG. 2F is a cross-sectional view illustrating a manufacturing step of the semiconductor device according to the first embodiment.

The spaces between the respective semiconductor chips 11a through 11h of the chip lamination 10 and between the second substrate 30 and the semiconductor chips 11h on the uppermost layer of the lamination are then filled with liquid resin to form the sealing resin 40 (FIG. 2F).

Figure 2G:
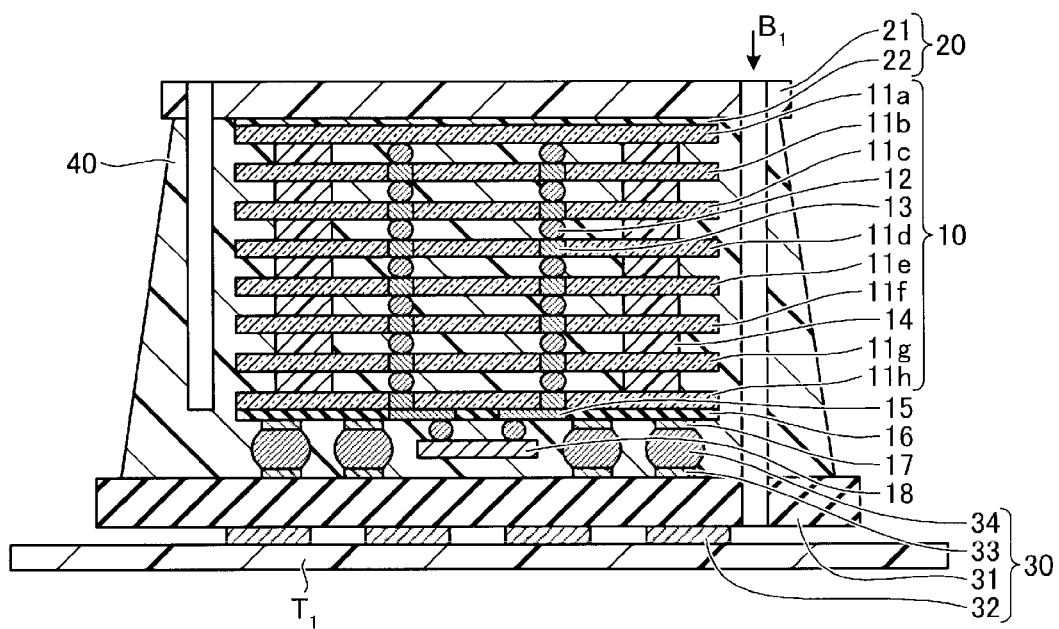
FIG. 2G is a cross-sectional view illustrating a manufacturing step of the semiconductor device according to the first embodiment.
Figure 2H:
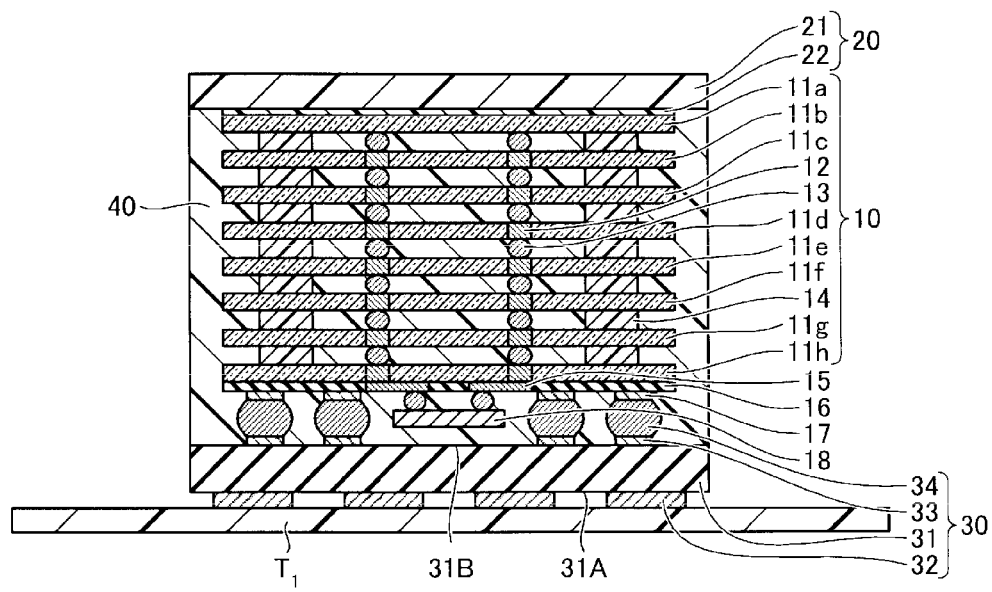
FIG. 2H is a cross-sectional view illustrating a manufacturing step of the semiconductor device according to the first embodiment.

The formed body is then affixed to a dicing tape $T_1$, aligned with a recognition mark on the first substrate 20 (resin film) of the chip lamination 10 with the reference, and the formed body is diced from the first substrate 20 towards the second substrate 30 using the blade $B_1$ to produce a discrete package (FIG. 2G). In this step, the sealing resin 40 sealing the spaces between the respective semiconductor chips 11a through 11h remains within the boundary of the cuts and under the first substrate 20 (resin 40 exists below the resin film corresponding to the first substrate 20). During the blade dicing, the first substrate 20 constituted by the resin film, the sealing resin 40, and the second substrate 30 are simultaneously cut while affixed to the dicing tape $T_1$ to avoid separation of the first and second substrates 20 and 30 and the sealing resin 40. This method can produce a structure having the smallest possible size and a uniform cross section (FIG. 2H). In mounting the formed body on the wiring substrate, the discrete laminated semiconductor device 1 is pinched using a collet (not shown) or the like, and stored in a tray, for example. By these steps, manufacture of the laminated semiconductor device 1 shown in FIG. 1A is completed.

According to this method, the liquid resin is applied from the side below the first substrate 20 as a thin layer to seal the spaces between the semiconductor chips 11a through 11h as well as between the second substrate 30 (wiring substrate) and the semiconductor chips 11h on the uppermost layer of the chip lamination 10. In this case, the sealing resin 40 exists below the first substrate 20 and encapsulates the semiconductor chips, whereby blade dicing can be carried out at positions near the semiconductor chips. Accordingly, a package having a size very close to the chip scale can be manufactured by a stable cutting step. Moreover, the cutting method, which eliminates the necessity of mold sealing again for the entire structure, requires only one type of resin, which improves the manufacturing efficiency. Furthermore, the reflow finishes in only one step, which reduces thermal stress during manufacturing and therefore increases reliability. Accordingly, advantages of package downsizing, cost reduction, reasonable manufacturing steps, and high reliability can be achieved. The sealing resin 40 is produced by hardening the liquid resin. Moreover, bump connection of the chip lamination is conducted after the temporary connection to the substrate. Thus, the bump connection areas are not fractured by stress produced when the chip lamination is mounted on the substrate, for example.

The second substrate 30 has wire nets (not shown) on the surface and in the interior of an insulating resin substrate, for example. The specific examples of the second substrate 30 involve a printed wiring board (such as a multilayer printed board) including glass-epoxy resin, BT resin (bismaleimide-triazine resin) or other insulating resin.

As shown in FIGS. 2A-2D, the chip lamination 10 is mounted on the first substrate 20 by bonding between the lower surfaces (not circuit surfaces) of the semiconductor chips 11a on the lowermost layer and the resin film 21 constituting the first substrate 20 via the thermosetting adhesive 22. The semiconductor chips 11a on the lowermost layer of the chip lamination 10 in the order of lamination are only bonded by the adhesive 22 made of insulating resin or the like, and not electrically connected with the first substrate 20 as direct connection. The semiconductor chips 11a on the lowermost layer are electrically connected with the wires equipped on the second substrate 30 via the plural semiconductor chips 11b through 11h.

The chip lamination 10 is so configured that the respective semiconductor chips 11a through 11h contained therein electrically connect with the adjoining semiconductor chips via the through electrodes (through silicon via: TSV) 12 provided within the semiconductor chips 11b through 11h on the second chip layer to the other chip layers, and the bump electrodes 13 connecting the respective through electrodes 12. The semiconductor chips 11b through 11h are sequentially laminated on the semiconductor chips 11a corresponding to the memory chips bonded to the first substrate 20. The semiconductor chips 11a are only bonded to the first substrate 20 by the adhesive 22, and electrically connected with only the semiconductor chips 11b on the second layer. Thus, the semiconductor chips 11a do not have through electrodes. However, the semiconductor chips 11a may have through electrodes which allow connection of wiring as necessary.

As noted above, the plural semiconductor chips 11a through 11h are electrically connected with each other by the through electrodes 12 provided on the semiconductor chips 11b through 11h (other than the semiconductor chips 11a), and the bump electrodes 13. FIG. 1A illustrates the simplified electric connection structure between the adjoining semiconductor chips. More specifically, the adjoining semiconductor chips 11a through 11h are electrically connected with each other by contact between the pad electrodes 11p equipped on the upper surfaces (circuit surfaces; i.e. the surface of the semiconductor chips 11a through 11h wherein electronic circuitry is formed) of the semiconductor chips on the lower side thereof and providing electric connection with the through electrodes 12 and the bump electrodes 13 provided on the lower surfaces (non circuit surfaces; i.e. the surface of the semiconductor chips 11a through 11h wherein that has no electronic circuitry formed thereon) of the semiconductor chips on the upper layer side. By fusion of the electrode terminals of at least one of the pad electrodes 11p and the bump electrodes 13 for combining the pad electrodes 11p and the bump electrodes 13, provides electrical connection with the through electrodes 12. As can be seen from the enlarged view of the main part in FIG. 1B, the bump electrodes 13 are members for connection with the pad electrodes 11p in FIG. 1A. The semiconductor chips 11b through 11h are sequentially laminated on the semiconductor chips 11a bonded to the first substrate 20 while electrically connected with the adjoining semiconductor chips 11 via the bump electrodes 13 as the connection members with the pad electrodes 11p.

The pad electrodes 11p are made of solder material comprising a Sn alloy containing Sn and Cu, Ag, Bi, In, or others added to Sn, or metal materials such as Au, Cu, Ni, Sn, Pd, and Ag, for example. The specific examples of the solder material (Pb-free solder) include Sn—Cu alloy, Sn—Ag alloy, and Sn—Ag—Cu alloy. The metal material is not limited to single-layer-film but may be lamination-layer-film containing plural metal films such as Ni/Au or Ni/Pd/Au. The metal material may be constituted by an alloy containing the metals referred to above. The combinations of the materials of the pad electrodes 11p and the bump electrodes 13 include "solder/solder", "metal/solder", "solder/metal", and "metal/metal", respectively, for example. The combinations of the shapes of the pad electrodes 11p and the bump electrodes 13 include a combination of both projecting shapes, such as semispherical shapes and columnar shapes, a combination of a projecting shape and a flat shape, such as a pad shape, for example.

At least one of the pad electrodes 11p or the bump electrodes 13 are made of solder material. In addition, considering the ease of handling of the semiconductor chips, or other points in the manufacturing process of the chip lamination 10, the pad electrodes contain metal materials such as Ni/Au and Ni/Pd/Au are disposed on the upper surfaces (circuit surfaces) of the semiconductor chips, and that laminations of the pad electrodes 11p and the bump electrodes 13 containing solder material such as Sn—Cu alloy, Sn—Ag alloy, and Sn—Ag—Cu alloy are disposed on the lower surfaces (non circuit surfaces) of the semiconductor chips. The bump material for the front surface may be opposite to the bump material for the rear surface. In this case, it is preferable that the pad electrodes 11p made of metal material have flat shapes, and that the bump electrodes 13 made of solder material have projecting shapes. When the surfaces having the flat pad electrodes 11p are equipped as such, the handling ease of the semiconductor chips increases, and the alignment accuracy between the semiconductor chips and connection by the bump electrodes 13 is improved.

According to this embodiment, the external shapes of the semiconductor chips 11a through 11h constituting the chip lamination 10 are uniform rectangular shapes. The thicknesses of the semiconductor chips 11a through 11h may also be uniform, as shown. However, the thickness of the semiconductor chip 11a may be greater than the thicknesses of each of the semiconductor chips 11b through 11h. When the thickness of the semiconductor chip 11a is thicker, stress generated by the difference in the coefficient of thermal expansion between the second substrate 30 as the wiring substrate and the semiconductor chips, warping of the semiconductor chips, poor connection between the semiconductor chips caused by these problems (poor connection by the bump electrodes) can be avoided.

The semiconductor chips 11b through 11h other than the semiconductor chips 11a may have thin cross sections for the purpose of reducing the thickness of the entire chip lamination 10 and thus the thickness of the laminated semiconductor device 1. More specifically, the semiconductor chips 11b through 11h may have a thickness of 50 μm or smaller. When the thickness of the semiconductor chip 11a is excessively large, the thickness of the chip lamination 10 increases, and the size of the laminated semiconductor device 1 becomes considerably large. Thus, the thickness of the semiconductor chip 11a is 300 μm or less. The chip thickness of the semiconductor chip 11a which does not require a through electrode can be easily increased.

As can be seen from the enlarged view of the main part in FIG. 1C, the rewiring layer 15 is provided on the surfaces of the semiconductor chips 11h. The rewiring layer 15 includes the insulating film 15a and the wiring layer 15b formed on the surfaces of the semiconductor chips 11h. The electrode pads 17 are provided at the connection position between the rewiring layer 15 and the IF chip 18, and at the connection position between the rewiring layer 15 and the wiring substrate corresponding to the second substrate 30. The surfaces of the semiconductor chips 11h are covered by a protection film 16 covering the surface of the rewiring layer 15.

While an example where the IF chip 18 containing an IF circuit is provided on the chip lamination 10 is discussed in this embodiment, the semiconductor chip mounted on the chip lamination 10 is not limited to the IF chip 18 equipped with only the IF circuit. For example, the IF chip 18 providing data communication between the chip lamination 10 and the external device may contain a controller circuit in addition to the IF circuit. A chip containing a mixture of the IF circuit and the controller circuit, i.e., a chip functioning both as controller and as an IF may be mounted on the chip lamination 10. Alternatively, both the chip containing the controller and the chip containing the IF circuit may be provided. These types are selected in an appropriate manner based on the purpose of use of the laminated semiconductor device 1, the structure of the external device, or other purposes.

The spaces between the semiconductor chips constituting the chip lamination 10, and further between the semiconductor chips 11h on the uppermost layer and the IF chip 18 are filled with the sealing resin (under-fill) 40.

According to the laminated semiconductor device 1 according to the first embodiment, the IF circuit is provided on a chip (IF chip 18) different from the semiconductor chips, and the chip containing the IF circuit is provided on the chip lamination 10. In this case, the external shapes of the plural semiconductor chips 11a through 11h can be equalized, and the size of the chip lamination 10 on which the plural semiconductor chips 11a through 11h are laminated, and further the package size of the laminated semiconductor device 1 containing the chip lamination 10 become smaller than the corresponding size of a structure which mounts the IF circuit on the memory chips on the lowermost layer, for example. Moreover, the plural semiconductor chips 11a through 11h have a uniform structure excepting the semiconductor chips 11a do not have the through electrodes 12. Accordingly, the laminated semiconductor device 1 can offer advantages such as improvement of development efficiency and a reduction of the manufacturing cost.

The chip lamination 10 electrically connects with the second substrate 30 via the internal electrode pads 17, the internal connection terminals 33, and the solder balls 34. In other words, the chip lamination 10 is only bonded to the second surface 31B (FIG. 1A) of the second substrate 30. According to this structure, the cost required for mounting the chip lamination 10 is minimized. In addition, the thickness of the semiconductor chip 11a on the lowermost layer which does not require the through electrode can be easily enlarged. This structure can decrease the effect of stress and warping of the semiconductor chip 11a produced when bonding the chip lamination 10 to the second substrate 30 by the difference in the coefficient of thermal expansion between the semiconductor chip 11a and the resin substrate 31 constituting the second substrate 30. These advantages can increase the electrical connection reliability between the respective semiconductor chips, particularly the electrical connection reliability between the semiconductor chips 11a and the semiconductor chips 11b on the second layer.

The IF chip 18 providing data communication between the chip lamination 10 and an external device is electrically connected with the second substrate 30 by flip-chip connection via the rewiring layer 15 formed on the semiconductor chips 11h on the uppermost layer and the internal connection terminals 33. In this case, the connection structure between the IF chip 18 and the second substrate 30 is simplified, whereby the number of manufacturing steps of the chip lamination 10 containing the IF chip 18 decreases and the manufacturing cost is lessened. The manufacturing costs are lower than the costs of producing a semiconductor device having the structure provided with through electrodes, or the like, within the memory chips, for connecting the IF chip 18 and the second substrate 30. Accordingly, a compact and highly reliable semiconductor memory device can be produced at a low cost. Moreover, the simplified connection structure between the IF chip 18 and the second substrate 30 can offer advantages such as an increase in the data communication speed between the chip lamination 10 and the external device.

Figure 5:
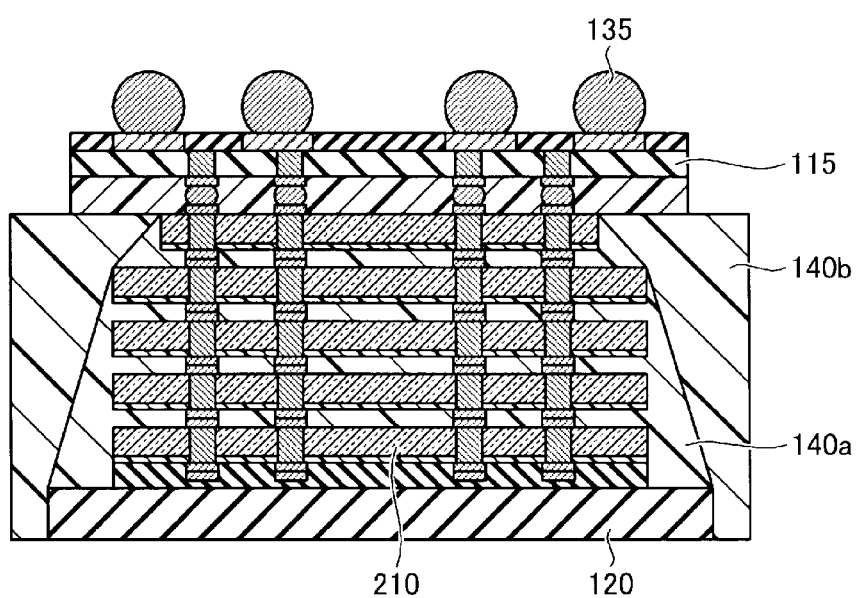
FIG. 5 is a cross-sectional view schematically illustrating the structure of a semiconductor device according to a conventional example.

A semiconductor device according to a comparison example is now explained. FIG. 5 is a cross-sectional view schematically illustrating an example of the semiconductor device for comparison. According to this example, a chip lamination 210 is produced by sequentially laminating chips on a carrying substrate 120 made of metal and provided with a member for preventing outflow of sealing material. The spaces between the respective chips are sealed by a resin 140a. Bumps on the interface chips on the uppermost layer are exposed. After this step, a wiring substrate 115 containing discrete rewiring is connected to the chips on the uppermost layer. After the periphery is sealed by a mold resin 140b, the mold resin 140b is diced. Components designated by a reference number 135 are solder balls for external connection. The comparison between FIG. 5 and FIG. 1A shows that the laminated semiconductor device according to the embodiment described herein can be far more easily manufactured, and can be considerably miniaturized.

Accordingly, the structure according to the embodiment of FIG. 1A can offer many advantages. In particular, the structure which includes the resin substrate 31 (shown in FIG. 1A) is easier to cut and the first and second substrate, 20 and 30, respectively, are both cut with the sealing resin 40 can provide extremely effective advantages of more desirable and easy cutting surfaces as well as size reduction of the device.

Second Embodiment

Figure 3:
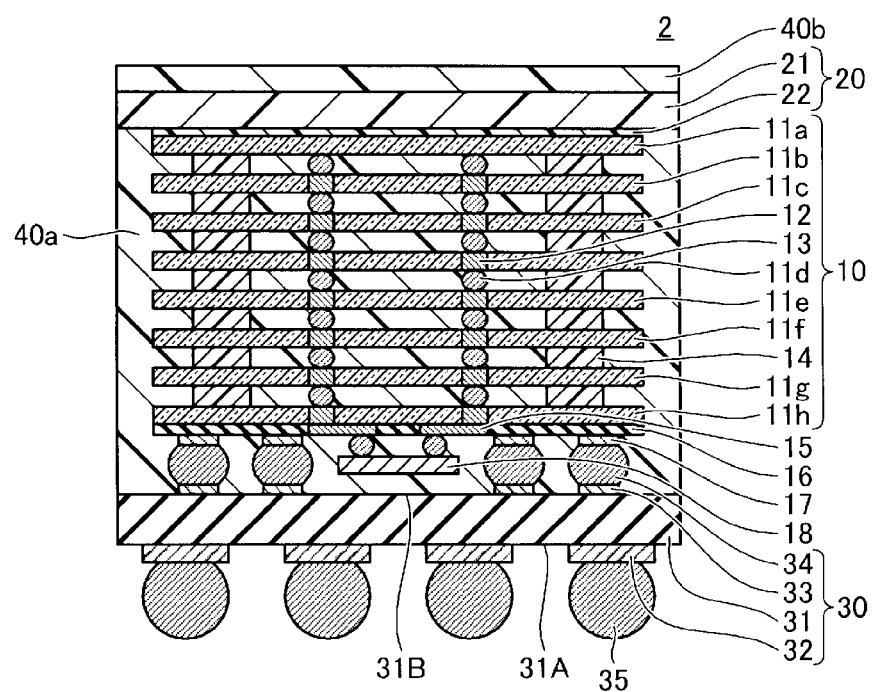
FIG. 3 is a cross-sectional view schematically illustrating the structure of a semiconductor device according to a second embodiment.
Figure 4A:
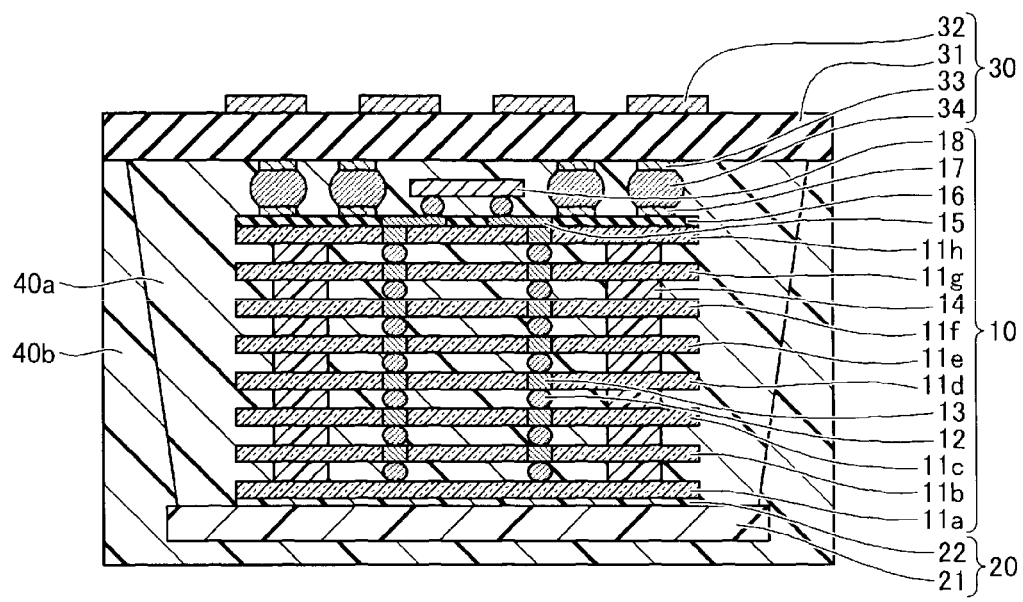
FIG. 4A is a cross-sectional view illustrating a manufacturing step of the semiconductor device according to the second embodiment.
Figure 4B:
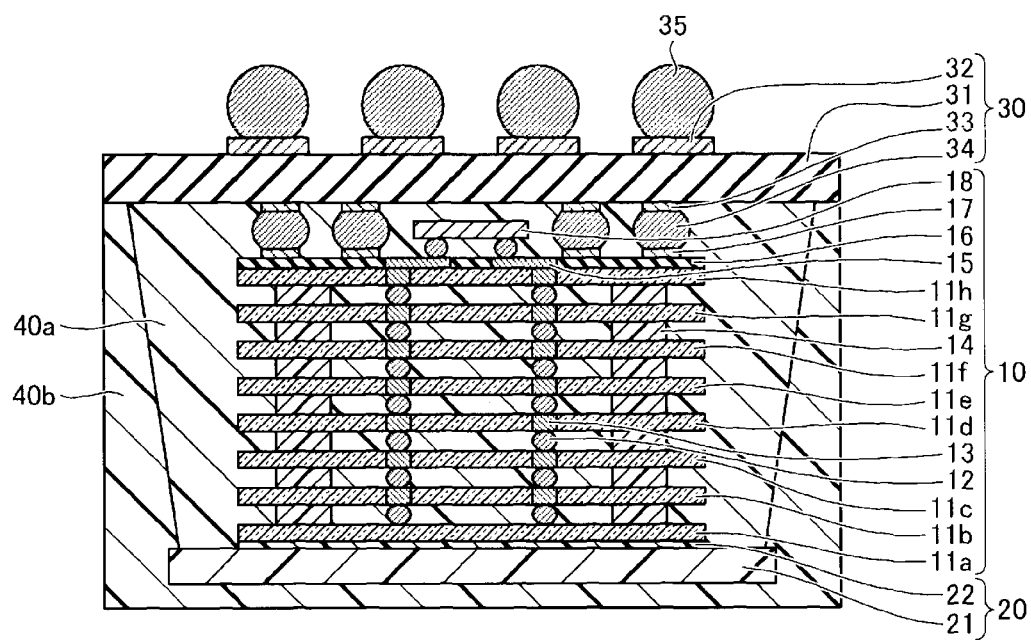
FIG. 4B is a cross-sectional view illustrating a manufacturing step of the semiconductor device according to the second embodiment.
Figure 4C:
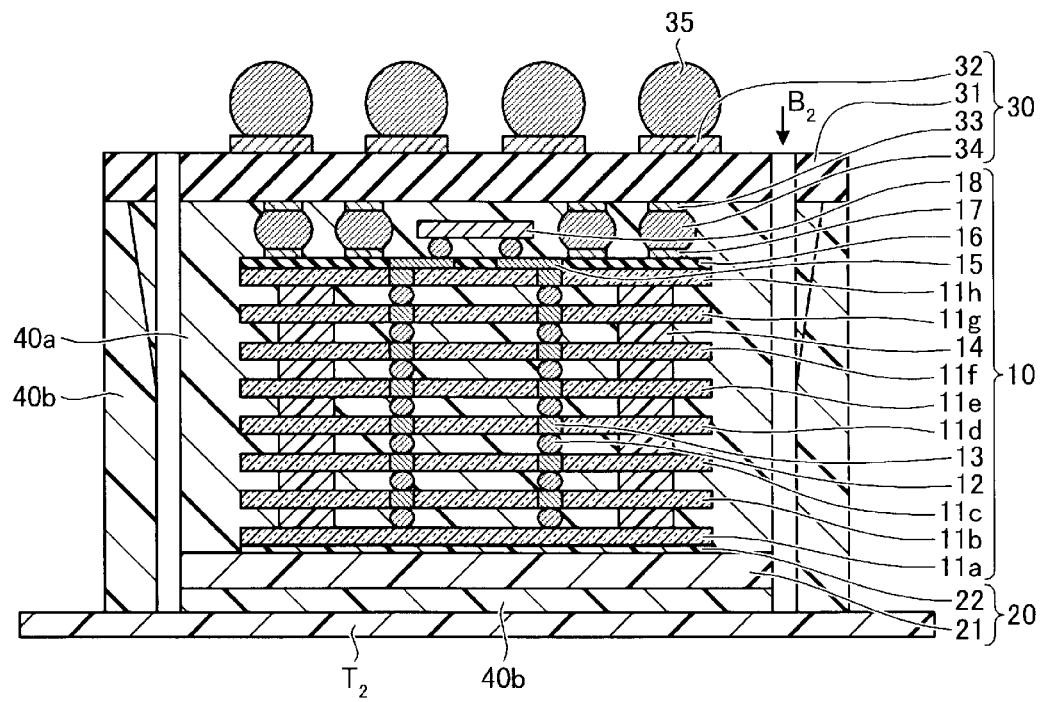
FIG. 4C is a cross-sectional view illustrating a manufacturing step of the semiconductor device according to the second embodiment.

FIG. 3 is a cross-sectional view schematically illustrating the structure of a laminated semiconductor device which constitutes a semiconductor memory device according to a second embodiment. FIGS. 4A through 4C are cross-sectional views showing manufacturing steps of this laminated semiconductor device. A laminated semiconductor device 2 according to this embodiment is manufactured in the same manner as in the manufacturing method of the laminated semiconductor device 1 according to the first embodiment up to the step immediately before the dicing step for separation of discrete pieces, i.e., the step shown in FIG. 2F. According to this embodiment, the chip lamination 10 is sealed by molding a second sealing resin 40b, such as epoxy resin containing fillers, using a metal mold (not shown) prior to separation into discrete pieces. Then, the solder balls 35 (shown in FIG. 4B) are mounted on the rear surface of the second substrate 30 corresponding to the wiring substrate. Then blade dicing is carried out using a blade $B_2$ (shown in FIG. 4C) from the second substrate 30 side to produce a discrete package (semiconductor device).

A manufacturing method of the laminated semiconductor device according to the second embodiment is hereinafter described. Concisely, the characteristic aspect of the method in the first embodiment is that the electrode connection and the resin sealing between the respective chips and between the chip and the second substrate can be achieved and provided substantially simultaneously, thus reducing manufacturing steps. According to the second embodiment, the steps from FIG. 2A to FIG. 2F in the first embodiment are similarly performed. However, the dicing step shown in FIG. 2G for separation of discrete pieces is not performed. Instead, resin sealing is provided using the second sealing resin 40b as illustrated in FIG. 4A.

Subsequently, the solder balls 35 are mounted on the external connection terminals 32 on the rear surface of the second substrate (wiring substrate) 30 (FIG. 4B).

After the formed body is affixed to a dicing tape $T_2$, blade dicing is performed using the blade $B_2$ from the rear surface side of the second substrate 30 (FIG. 4C) for separation of the laminated semiconductor device 2 into discrete packages.

Other structures having the same reference numerals are similar to the corresponding structures of the laminated semiconductor device 1 in the first embodiment and are not described for brevity. The laminated semiconductor device 2 includes the first and second substrates 20 and 30 disposed in an opposing relation to each other and having the same size. The chip lamination 10 containing the plural layers of the semiconductor chips 11a through 11h are sandwiched between the first and second substrates 20 and 30 in such a condition as to electrically connect with at least either one of the first and second substrates 20 and 30, and the first and second sealing resins 40a and 40b encapsulates the chip lamination 10. The first sealing resin 40a seals the spaces between the first and second substrates 20 and 30, between the semiconductor chips constituting the lamination 10, and between the lamination 10 and the first and second substrate 20 and 30. The outer peripheries of the first and second sealing resins 40a and 40b lie on a line connecting the outer peripheries of the first and second substrates 20 and 30.

This method requires a larger number of steps, and two types of sealing resins of the first sealing resin 40a formed from hardened liquid resin, and the second sealing resin 40b formed by molding. However, the method can provide the solder balls 35 corresponding to external connection terminals. Moreover, as illustrated in FIG. 3, the first substrate 20 constituted by resin film is covered with the second sealing resin 40b formed by mold resin containing fillers. In this aspect, moisture resistance of the laminated semiconductor device 2 is improved. Furthermore, while laser marking processing is difficult to be applied to the surface of the first substrate 20 constituted by resin film, this problem can be solved by covering the surface of the first substrate 20 with mold resin containing fillers (second sealing resin 40b) for easy marking.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a laminated semiconductor device, comprising:
   positioning a plurality of first semiconductor chips in a layer in the same plane on a first substrate, and bonding the first semiconductor chips to the first substrate;
   stacking at least one layer of second semiconductor chips on respective first semiconductor chips leaving a space therebetween;
   cutting the first substrate into a discrete lamination;
   aligning a first electrode pad provided on a surface of the lamination with a second electrode pad on a second substrate, and temporarily connecting the electrode pads on the lamination and the second substrate in an opposing relation to the first substrate;
   providing electrical connections between the first and second electrode pads by a reflow process;
   flowing a liquid resin from the side of the first substrate to seal the spaces between the respective semiconductor chips and between the lamination and the second substrate; and
   cutting edges of the resin, the first substrate and the second substrate to separate the lamination into a discrete device.

2. The method according to claim 1, wherein the first substrate comprises a resin material.

3. The method according to claim 1, wherein the lamination is cut by a dicing blade from the side of the first substrate towards the second substrate for separating the lamination into the discrete device.

4. The method according to claim 3, wherein the first substrate comprises a resin material.

5. The method according to claim 1, further comprising:
   flowing a sealing resin containing fillers and sealing the periphery of the lamination with the resin prior to the cutting the edges of the resin.

6. The method according to claim 5, wherein the lamination is cut by a dicing blade from the side of the second substrate towards the first substrate for separating the lamination into the discrete device.

7. The method according to claim 5, wherein the first substrate comprises a resin material.

8. A manufacturing method of a laminated semiconductor device, comprising:
   positioning a plurality of first semiconductor chips in the same plane on a first resin-containing substrate, and bonding the first semiconductor chips to the first substrate;
   aligning a plurality of second semiconductor chips with front surfaces or rear surfaces of the first semiconductor chips using a photosensitive bonding film patterned into a desired pattern, and heating the aligned semiconductor chips to laminate at least one layer of second semiconductor chips on the respective first semiconductor chips and forming a flow path for a liquid resin;
   cutting the first substrate for separation into a plurality of discrete laminations;
   aligning an electrode pad provided on a surface of one the plurality of discrete laminations with an electrode pad on a second substrate, and temporarily connecting the electrode pads on the discrete lamination and the second substrate in an opposing relation to the first substrate;
   providing electrical connections between each of the electrode pads by a reflow process;
   flowing the liquid resin from the side of the first substrate toward the second substrate to seal spaces between the first and second semiconductor chips and between the second semiconductor chips and the second substrate with the liquid resin; and
   cutting the discrete lamination by a dicing blade to form a discrete device.

9. The method according to claim 8, wherein the discrete lamination is cut by the dicing blade from the side of the first substrate towards the second substrate to form the discrete device.

10. The method according to claim 8, wherein the discrete lamination is cut by the dicing blade from the side of the second substrate towards the first substrate to form the discrete device.

11. The method according to claim 8, wherein the dicing blade cuts edges of the resin, and the first and second substrate to form the discrete device.

12. The method according to claim 11, wherein the discrete lamination is cut by the dicing blade from the side of the first substrate towards the second substrate to form the discrete device.

13. The method according to claim 11, wherein the discrete lamination is cut by the dicing blade from the side of the second substrate towards the first substrate to form the discrete device.

14. The method according to claim 8, further comprising:
   flowing a sealing resin containing fillers and sealing the periphery of the discrete lamination with the sealing resin prior to the cutting the discrete lamination.

15. The method according to claim 14, wherein the discrete lamination is cut by the dicing blade from the side of the first substrate towards the second substrate to form the discrete device.

16. The method according to claim 14, wherein the discrete lamination is cut by the dicing blade from the side of the second substrate towards the first substrate to form the discrete device.

* * * * *